United States Patent
Zheng

(10) Patent No.: US 7,324,861 B1
(45) Date of Patent: Jan. 29, 2008

(54) NUMERICAL CONTROL SYSTEM AND METHOD FOR LASER CUTTING SMT STENCIL

(76) Inventor: Chun Bin Zheng, Room 401, No. 103, Baoan New Garden, Minhang District, Shanghai (CN) 201100

( * ) Notice: Subject to any disclaimer, the term of this patent is extended or adjusted under 35 U.S.C. 154(b) by 0 days.

(21) Appl. No.: 11/564,969

(22) Filed: Nov. 30, 2006

(51) Int. Cl.
*G06F 19/00* (2006.01)

(52) U.S. Cl. ............................ 700/97; 700/117

(58) Field of Classification Search ............. 700/96, 700/97, 117, 166, 181, 182; 257/529, 534; 219/121.6

See application file for complete search history.

(56) References Cited

U.S. PATENT DOCUMENTS

| | | | |
|---|---|---|---|
| 4,530,061 A * | 7/1985 | Henderson et al. | 700/183 |
| 5,670,067 A * | 9/1997 | Koide et al. | 219/121.68 |
| 5,910,282 A * | 6/1999 | Grozdanovski et al. | 623/27 |
| 2001/0023975 A1 * | 9/2001 | Hirota | 257/529 |
| 2003/0114953 A1 * | 6/2003 | Rutkowski | 700/181 |
| 2004/0053426 A1 * | 3/2004 | Shigenobu | 436/533 |
| 2005/0071996 A1 * | 4/2005 | Ray | 29/829 |

* cited by examiner

*Primary Examiner*—Kidest Bahta

(57) ABSTRACT

A numerical control system for laser cutting an SMT stencil includes a mechanical control portion (2) and a laser control portion (3). The mechanical control portion includes a first main control system (21), a first host computer isolation interface (22), a first communication interface controller (24), a first optoelectronic/magnetic isolator (25), and a first isolated input/output interface (23) coupled to a mechanical transmission device. Similarly, the laser control portion includes a second main control system (31), a second host computer isolation interface (32), a second communication interface controller (34), a second optoelectronic/magnetic isolator (35), and a second isolated input/output interface (33) coupled to a laser cutting device. The first and second main control systems are connected with the host computer via the respective first and second host computer isolation interfaces. The first and second optoelectronic/magnetic isolators are connected with a slave computer. The numerical control system can be further divided into a cutting management module (4) and a stencil output module (5). A numerical control method associated with the above numerical control system for laser cutting an SMT stencil is also disclosed.

4 Claims, 2 Drawing Sheets

NUMERICAL CONTROL SYSTEM AND METHOD FOR LASER CUTTING SMT STENCIL

BACKGROUND OF THE INVENTION

1. Field of the Invention

The present invention relates to a numerical control system and method, and particularly to a numerical control system and method for laser cutting an SMT (Surface Mount Technology) stencil.

2. Description of Prior Art

Laser cutting equipment is highly specialized precision machining and manufacturing facility. As a sunrise industry in the 21-century, the laser cutting industry is actively supported and developed by the developed countries, such as European countries, USA, and Japan. Currently, LPKF Laser and Electronics of Germany is the world's leading manufacturer of precision laser cutting equipment. American companies have substantially withdrawn from competition since the mechanical stability of their products is not as good as those from Germany. The Japanese products are of a lower quality level than those from Europe and America both in the software and hardware aspects, and thus finding no position in the market. Taiwanese products, which are simply duplicates of the Germany products, are still in the testing stage and employ general software rather than specific CAM (Computer Aided Machining) software. The servo driving and mechanical transmission are accomplished by linear guides, not the combination of a linear motor and a gas levitation system. In addition, both the characteristics and machining precision of the laser system and optical imaging system are not sufficient.

In the current electronic industry, the market cycle becomes increasingly short, and the quality requirement becomes increasingly high. Specifically, for printing stencils, which act as a mold in the SMT machining process, the quality requirements must be completely satisfied except for on-time delivery. To fulfill this purpose, a computer aided manufacturing system is preferred.

Accordingly, a numerical control system and method for laser cutting an SMT stencil is desired.

SUMMARY OF THE INVENTION

An object of the present invention is to provide a numerical control system for laser cutting an SMT stencil.

Another object of the present invention is to provide a numerical control method for laser cutting an SMT stencil.

According to another aspect of the present invention, a numerical control system for laser cutting an SMT stencil comprises a mechanical control portion and a laser control portion. The mechanical control portion comprises a first main control system, a first host computer isolation interface, a first communication interface controller, a first optoelectronic/magnetic isolator, and a first isolated input/output interface coupled to a mechanical transmission device. Similarly, the laser control portion comprises a second main control system, a second host computer isolation interface, a second communication interface controller, a second optoelectronic/magnetic isolator, and a second isolated input/output interface coupled to a laser cutting device. The first and second main control systems are connected with the host computer via the respective first and second host computer isolation interfaces. The first and second optoelectronic/magnetic isolators are connected with a slave computer.

According to one aspect of the present invention, a numerical control method for laser cutting an SMT stencil comprises the following steps:

(1) initializing and testing constituent portions of the numerical control system according to the specific requirements;

(2) initially connecting the first and second main control systems with the laser cutting device and the mechanical transmission device, respectively;

(3) the first and second main control systems determining the type of interface board according to returned data and implementing corresponding procedures, such as data processing and interface initialization;

(4) the first and second main control systems exchanging data with the respective first and second isolated input/output interfaces, and sending received data to a display controller that controls a screen to display corresponding information; and (5) the first and second main control systems reporting the data to the host computer; if the host computer determines that the data returned from the constituent portions is correct, the numerical control system is brought into a normal operational state; in the normal operational state, the first and second main control systems respectively control the operations of the laser cutting device and the mechanical transmission device based on the data and control signals from the host computer, and momentarily feed back corresponding information, such as the system operational status, to the host computer; the operational control of the laser cutting device and the mechanical transmission device including starting or stopping the device, moving the device in X- and Y-directions, controlling the laser power and the voltage.

The first and second main control systems employ high-speed processors. To ensure reliable operation of the main control systems, necessary anti-interference measures, such as isolation and filtering of interface and input/output port, are taken.

Based on the numerical control method as provided above, the present numerical control system for laser cutting an SMT stencil may also be regarded as being composed of a cutting management module and a stencil output module.

The cutting management module comprises a stencil positioning and correcting unit, a setting and adjusting unit for device parameters, a stencil display unit for real-time displaying the stencil shape, a tool setting unit for selecting cutting parameters, and a sequence setting unit for adjusting machining sequence of the same stencil shape. The stencil positioning and correcting unit accurately positions an aperture in the stencil by means of a CCD (Charge Coupled Device), locates three reference points in the stencil, and respectively reads the coordinate positions of the three reference points via CCD. After calculation, each configured aperture position in the program can be coordinated with the actual position of a corresponding stencil aperture.

The stencil output module comprises a sequence control unit for adjusting stencil machining sequence, a status control unit for monitoring device operation status, a device control unit for controlling auxiliary devices, a gas pump control unit for controlling a gas pump, a platform control unit for controlling the mechanical transmission device, a laser control unit for controlling laser parameters, and a tool control unit for setting the cutting tools.

By adoption of the present numerical control system and method, the laser cutting process of a printing stencil can be computerized, whereby the final product precision and machining efficiency are effectively increased.

BRIEF DESCRIPTION OF THE DRAWINGS

The present invention may best be understood through the following description with reference to the accompanying drawings, in which.

DETAILED DESCRIPTION OF THE PREFERRED EMBODIMENT AND BEST MODE FOR CARRYING OUT THE INVENTION

Figure 1:
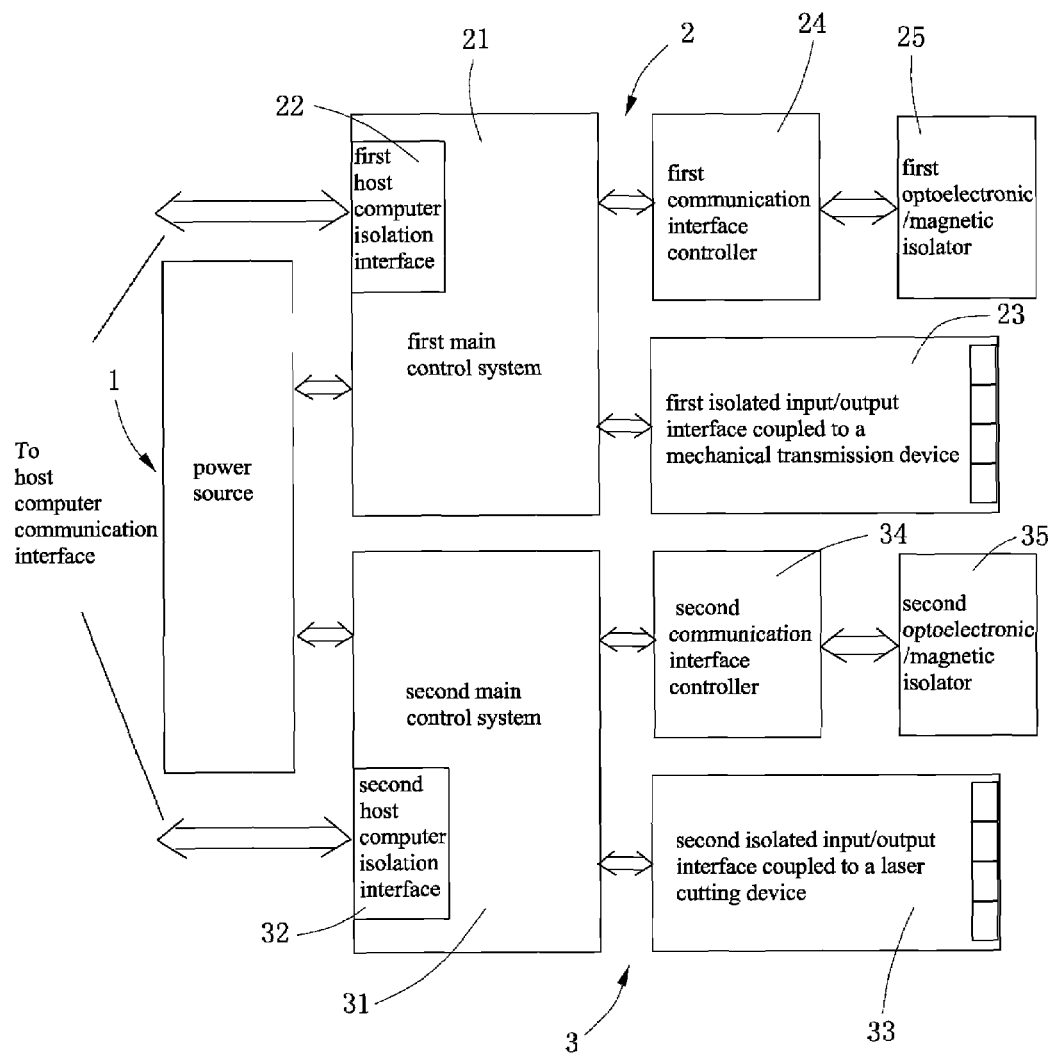
FIG. 1 is a schematic view illustrating a configuration of a numerical control system for laser cutting an SMT stencil in accordance with the present invention.

Referring to FIG. 1, a numerical control system for laser cutting an SMT stencil in accordance with the present invention comprises a mechanical control portion 2 and a laser control portion 3. The mechanical control portion 2 comprises a first main control system 21, a first host computer isolation interface 22, a first communication interface controller 24, a first optoelectronic/magnetic isolator 25, and a first isolated input/output interface 23 coupled to a mechanical transmission device. Similarly, the laser control portion 3 comprises a second main control system 31, a second host computer isolation interface 32, a second communication interface controller 34, a second optoelectronic/magnetic isolator 35, and a second isolated input/output interface 33 coupled to a laser cutting device. The main control system 21, 31 is in the form of an MCU (Micro Controller Unit) with 128 K flash memory, RAM (Read Access Memory) and extended RAM. System management software and application software are installed in the flash memory for controlling the operation status of the entire system. The first and second main control systems 21, 31 are connected with the host computer via the respective first and second host computer isolation interfaces 22, 32. The first and second optoelectronic/magnetic isolators 25, 35 are connected with a slave computer for preventing the communication interface controller 24 from adverse static interference and electromagnetic interference from the slave computer.

The mechanical control portion 2 and the laser control portion 3 are powered by a power source 1. As is known, SMT stencil laser cutting equipment is composed of a laser cutting device and a mechanical transmission device. The mechanical transmission device is moved under the control of the first main control system 21 to drive the laser cutting device, and the laser cutting device proceeds with the stencil cutting process under the control of the second main control system 31. The configuration of the laser cutting device may be referred to Chinese Patent Application No. 200510025408.5 filed by the inventor. Since the configuration of a laser cutting device is not involved in the inventive concept of the present invention, a detailed description thereof is thus omitted.

According to another aspect of the present invention, a numerical control method associated with the above-described numerical control system for laser cutting an SMT stencil comprises the following steps:

(1) initializing and testing constituent portions of the numerical control system according to specific requirements, including setting the communication interface parameters, setting the interface working mode, starting the pneumatic system and the water cooling system, testing whether the operations of the constituted portions are normal or abnormal, and the likes;

(2) initially connecting the first and second main control systems 21, 31 with the laser cutting device and the mechanical transmission device, respectively;

(3) the first and second main control systems 21, 31 determining the type of interface board according to the returned data and implementing corresponding procedures, such as data processing and interface initialization, to realize simultaneous connection with the laser cutting device and the mechanical transmission device;

(4) the first and second main control systems 21, 31 exchanging data with the respective first and second isolated input/output interfaces 23, 33, and sending received data to a display controller that controls a screen to display corresponding information, updating or remote transmitting the received data via serial ports, or sending the received data to a local printer via parallel ports; and (5) the first and second main control systems 21, 31 reporting the data to the host computer; if the host computer determines that the data returned from the constituent portions is correct, the numerical control system is brought into a normal operational state; in the normal operational state, the first and second main control systems 21, 31 respectively control the operations of the laser cutting device and the mechanical transmission device based on the data and control signals from the host computer, and momentarily feed back corresponding information, such as the system operational status, to the host computer; the operational control of the laser cutting device and the mechanical transmission device including starting or stopping the device, moving the device in X- and Y-directions, controlling the laser power, the voltage and the likes.

The first and second main control systems 21, 31 employ high-speed processors. To ensure reliable operation of the main control systems 21, 31, necessary anti-interference measures, such as isolation and filtering of interface and input/output port, are taken.

Figure 2:
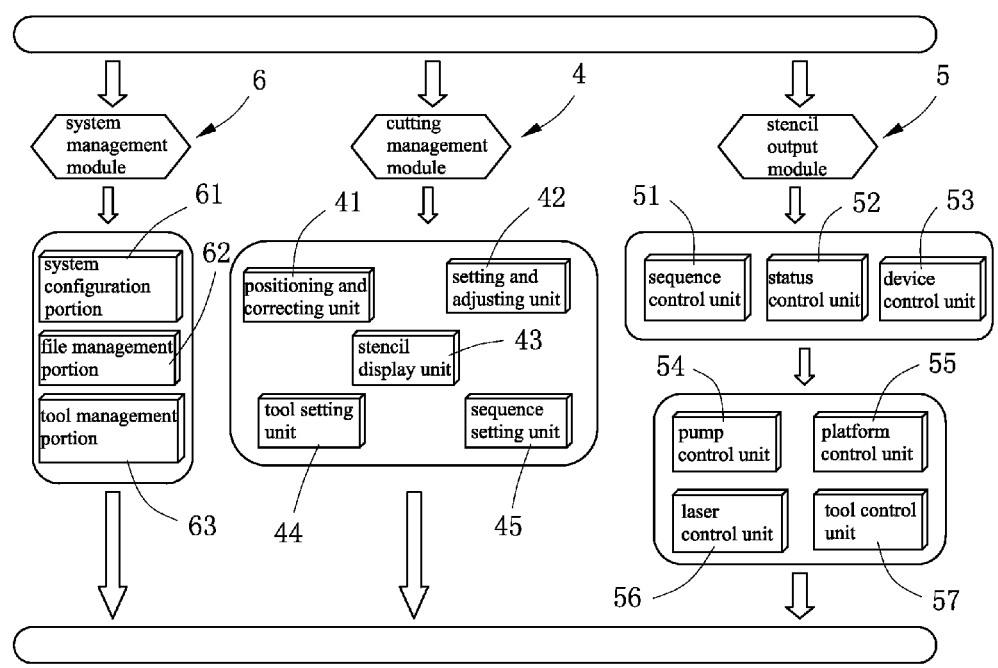
FIG. 2 is a flowchart illustrating a process of a numerical control method for laser cutting an SMT stencil in accordance with the present invention.

Based on the numerical control method as provided above, the present numerical control system for laser cutting an SMT stencil may also be regarded as being composed of a cutting management module 4 and a stencil output module 5 as shown in FIG. 2.

The cutting management module 4 comprises the following units:

(1) a positioning and correcting unit 41 that accurately positions an aperture in the stencil by means of a CCD (Charge Coupled Device), locates three reference points in the stencil, and respectively reads the coordinate positions of the three reference points via CCD. After calculation of the software, each configured aperture position in the program can be coordinated with the actual position of a corresponding stencil aperture. The stencil can be further processed by adding or enlarging apertures thereof to achieve the reprocess capability. That is, after finishing machining and shipping of the stencil, the stencil can be further positioned on the laser cutting equipment for aperture modification.

(2) a setting and adjusting unit 42 for changing the device parameters, such as the laser power and the movement velocity of the working table, so that the devices can be operated in an optimal state.

(3) a stencil display unit 43 for real-time displaying the stencil shape in a software interface window. The stencil shape can be enlarged or reduced. Accordingly, the laser cutting process can be monitored by means of the software.

(4) a tool setting unit 44 for selecting cutting parameters as desired. For a thick steel sheet, low velocity and large power are selected. For a thin steel sheet, high velocity and small power are selected.

(5) a sequence setting unit 45 for adjusting machining sequence of the same stencil shape. In other words, the unit ensures a first-selected-first-served operation.

The stencil output module 5 comprises the following units:

(1) a sequence control unit 51 for adjusting machining sequence of different stencils. The sequence control unit 51 comprises a cutting time estimation function. Since the cutting process is a linear movement, the perimeter of each stencil aperture can be obtained from the input shape data, the total length is then obtained, and finally the cutting time can be estimated according to the selected cutting velocity. Based on the estimated cutting time, the machining sequence of different stencils can be adjusted and arranged.

(2) a status control unit 52 for monitoring device operation status including gas pressure, cooling temperature and so on. When a malfunction status presents, automatic stop is effected.

(3) a device control unit 53 for controlling auxiliary devices.

(4) a gas pump control unit 54 for controlling the pressure, opening and closing of the gas pump.

(5) a platform control unit 55 for controlling the movement direction and velocity of the mechanical transmission device.

(6) a laser control unit 56 for controlling laser parameters, such as power and focal length.

(7) a tool control unit 57 for selecting and setting the cutting tools. Various parameter combinations are considered, which include the laser beam diameter, the laser power, cutting velocity, opening and closing time of the cutting tool, and pulse frequency.

The cutting management module 4 and the stencil output module 5 cooperate with a system management module 6. As shown in FIG. 2, the system management module 6 comprises a system configuration portion 61, a file management portion 62 and a tool management portion 63.

By adoption of the present numerical control system and method, the laser cutting process of a printing stencil can be computerized, whereby the final product precision and machining efficiency are effectively increased.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A numerical control method for laser cutting an SMT stencil associated with a numerical control system, the numerical control system including a mechanical control portion and a laser control portion; the mechanical control portion including a first main control system, a first host computer isolation interface, a first communication interface controller, a first optoelectronic/magnetic isolator, and a first isolated input/output interface for being coupled to a mechanical transmission device; the laser control portion including a second main control system, a second host computer isolation interface, a second communication interface controller, a second optoelectronic/magnetic isolator, and a second isolated input/output interface for being coupled to a laser cutting device; the first and second main control systems being connected with a host computer via the respective first and second host computer isolation interfaces, the first and second optoelectronic/magnetic isolators being connected with a slave computer; the numerical control method comprising the following steps:

1) initializing and testing constituted portions of the numerical control system;

2) initially connecting the first and second main control systems of the numerical control system with the laser cutting device and the mechanical transmission device, respectively;

3) the first and second main control systems determining the type of interface board according to the returned data and implementing corresponding procedures, such as data processing and interface initialization;

4) the first and second main control systems exchanging data with the respective first and second isolated input/output interfaces, and sending the received data to a display controller that controls a screen to display corresponding information; and 5) the first and second main control systems reporting the data to the host computer; if the host computer determines that the data returned from the constituted portions of the numerical control system is correct, the numerical control system is brought into a normal operational state; in the normal operational state, the first and second main control systems respectively control the operations of the laser cutting device and the mechanical transmission device based on the data and control signals from the host computer, and momentarily feed back corresponding information, the system operational status, to the host computer; the operational control of the laser cutting device and the mechanical transmission device including starting or stopping the device, moving the device in X, Y directions, controlling the laser power and the voltage.

2. The numerical control method for laser cutting an SMT stencil as claimed in claim 1, wherein step 3) further comprising accurately positioning an aperture in the stencil by means of a CCD (Charge Coupled Device), locating three reference points in the stencil, and respectively reading the coordinate positions of the three reference points by CCD; after calculation by software, each configured aperture position in the program is coordinated with the actual position of a corresponding stencil aperture for positioning and correcting purposes.

3. The numerical control method for laser cutting an SMT stencil as claimed in claim 1, wherein step 4) further comprising updating or remote transmitting the received data via serial ports by the first and second main control portions, and sending the received data to a local printer via parallel ports by the first and second main control portions.

4. The numerical control method for laser cutting an SMT stencil as claimed in claim 1, wherein step 5) further comprising inputting stencil shape data to obtain the perimeter of each stencil aperture, then the total length, and finally the estimated cutting time according to the selected cutting velocity.

* * * * *